(12) United States Patent
Miyata

(10) Patent No.: US 9,982,867 B2
(45) Date of Patent: May 29, 2018

(54) WAVELENGTH CONVERTING MEMBER AND LIGHT SOURCE DEVICE HAVING THE WAVELENGTH CONVERTING MEMBER

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 0 days. days.

(21) Appl. No.: 15/167,012

(22) Filed: May 27, 2016

(65) Prior Publication Data

US 2016/0348857 A1 Dec. 1, 2016

(30) Foreign Application Priority Data

May 29, 2015 (JP) .................................. 2015-110572
Jul. 16, 2015 (JP) .................................. 2015-142437

(51) Int. Cl.
*F21V 9/16* (2006.01)
*F21V 29/502* (2015.01)
(Continued)

(52) U.S. Cl.
CPC .............. *F21V 9/16* (2013.01); *F21V 29/502* (2015.01); *H01L 33/644* (2013.01); *F21K 9/64* (2016.08); *F21V 29/56* (2015.01); *F21W 2131/406* (2013.01); *F21Y 2115/10* (2016.08); *F21Y 2115/15* (2016.08); *H01L 33/502* (2013.01); *H01L 33/648* (2013.01)

(58) Field of Classification Search
CPC ... F21V 9/12; F21V 9/16; F21V 29/56; F21V 29/502; H01L 33/644; H01L 33/502; H01L 33/648

USPC .......... 362/84, 260, 267, 268, 294, 547, 264
See application file for complete search history.

(56) References Cited

U.S. PATENT DOCUMENTS 6,397,935 B1 * 6/2002 Yamamoto .......... F28D 15/0233
165/104.21
2002/0056542 A1 * 5/2002 Yamamoto .......... F28D 15/0233
165/80.3
(Continued)

FOREIGN PATENT DOCUMENTS

JP 10-38484 A 2/1998
JP 2002-022379 A 1/2002
(Continued)

OTHER PUBLICATIONS

Japanese Office Action application No. 2015-142437 dated Apr. 18, 2017.
(Continued)

*Primary Examiner* — Paultep Savusdiphol
(74) *Attorney, Agent, or Firm* — Squire Patton Boggs (US) LLP

(57) ABSTRACT

A wavelength converting member includes a sealed housing which is at least partially light transmissive, a coolant enclosed in the sealed housing, a cooling part provided on a part of an external surface of the sealed housing, and a channel having a plurality of micro-passages allowing a liquid coolant flowing therein. At least a portion of the micro-passages are formed by gaps between particles, and phosphor particles are contained in the particles.

18 Claims, 10 Drawing Sheets

(51) Int. Cl.
*H01L 33/64* (2010.01)
*F21V 29/56* (2015.01)
*F21W 131/406* (2006.01)
*F21K 9/64* (2016.01)
*F21Y 115/10* (2016.01)
*F21Y 115/15* (2016.01)
*H01L 33/50* (2010.01)

(56) References Cited

U.S. PATENT DOCUMENTS

2009/0309116 A1* 12/2009 Kato .................. C09K 11/7721
257/98
2016/0013374 A1* 1/2016 Dijken .................. H01L 33/486
257/98

FOREIGN PATENT DOCUMENTS

| JP | 2004-028406 A | 1/2004 |
| JP | 2010-197500 A | 9/2010 |
| JP | 2011-075657 A | 4/2011 |
| JP | 2012-078707 A | 4/2012 |
| JP | 2014-032350 A | 2/2014 |
| JP | 2014-085555 A | 5/2014 |
| JP | 2015-032599 A | 2/2015 |

OTHER PUBLICATIONS

Office Action dated Jun. 20, 2017 corresponding to Japanese Patent Application No. 2015-110572.

* cited by examiner

WAVELENGTH CONVERTING MEMBER AND LIGHT SOURCE DEVICE HAVING THE WAVELENGTH CONVERTING MEMBER

CROSS-REFERENCE TO RELATED APPLICATION

The present application claims priority under 35 U. S. C. § 119 to Japanese Patent Application No. 2015-110572, filed May 29, 2015. The entire disclosure of Japanese Patent Application No. 2015-110572 is hereby incorporated herein by reference.

BACKGROUND

Field:

The present disclosure relates to a wavelength converting member containing a fluorescent material that is configured to emit light, upon receiving an incident light, of a wavelength different from the wavelength of the incident light, and to a light source device having the wavelength converting member.

Description of the Related Art:

In recent years, light source devices employing light sources that use semiconductor lasers (LDs) or light emitting diodes (LEDs), and fluorescent materials configured to emit light, upon receiving an incident light, of a wavelength different from the wavelength of the incident light, have become popular. In such light source devices employing fluorescent materials, an increase in the temperature of the fluorescent materials while converting wavelength may result in a decrease in the light converting efficiency of the fluorescent materials. To address such a disadvantage, JP2010-197500A proposes a light source device in which a coolant containing a fluorescent material is circulated in a circulation channel by a pump while the coolant containing the fluorescent material is cooled by a cooler provided to the circulation channel.

The light source device described in Japanese unexamined patent publication No. 2010-197500 requires a circulation channel and a pump to circulate a coolant in the circulation channel, so that miniaturization of the light source device is difficult, and the number of components also increases, which increases the manufacturing cost. In particular, driving a pump increases the energy consumption in operation.

Accordingly, an object of the present disclosure is to improve disadvantages described above, and to provide a wavelength converting member that can cool the fluorescent material efficiently without using a driving source and exhibits low energy consumption in operation, and to provide a light source device having the wavelength converting member.

SUMMARY

According to one aspect of the present disclosure, a wavelength converting member includes a sealed housing which is at least partially light transmissive, a coolant enclosed in the sealed housing, a cooling part provided on a part of an external surface of the sealed housing, and a channel arranged in the sealed housing and having a plurality of micro-passages allowing a liquid coolant flowing therein. At least a portion of the micro-passages are formed by gaps between particles, and phosphor particles are contained in the particles.

A light source device according to one aspect of the present disclosure includes the wavelength converting member according to the aforedescribed aspect and a light source to emit light to the wavelength converting member.

As described above, according to the present disclosure, a wavelength converting member that can cool the fluorescent material efficiently without using a driving source and exhibits low energy consumption in operation, and a light source device having the wavelength converting member can be provided.

BRIEF DESCRIPTION OF THE DRAWINGS

FIG. 6A shows a case where a sealed housing is substantially rectangular parallelepiped in shape with substantially rectangular upper and lower surfaces. FIG. 6B shows a case where a sealed housing is substantially cylindrical in shape with substantially circular upper and lower surfaces.

DETAILED DESCRIPTION

Figure 1:
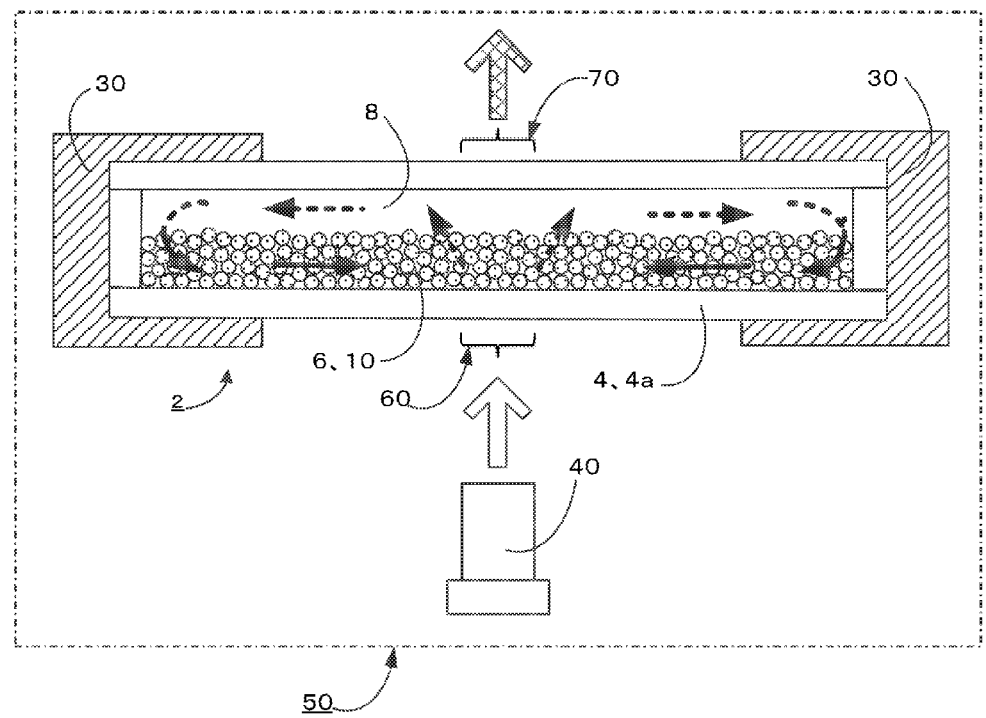
FIG. 1 is a schematic cross-sectional view showing a light source device having a wavelength converting member according to one embodiment of the present disclosure.

A wavelength converting member according to a first aspect of the present disclosure includes a sealed housing which is at least partially light transmissive, a coolant enclosed in the sealed housing, a cooling part provided on a part of an external surface of the sealed housing, and a channel arranged in the sealed housing and having a plurality of micro-passages allowing a liquid coolant flowing therein. At least a portion of the micro-passages are formed by gaps between particles, and phosphor particles are contained in the particles.

According to the first aspect, when light enters phosphor particles through a light-transmissive surface, light of a different wavelength region than that of the incident light can be emitted by the phosphor particles. The temperature of the phosphor particles increases during the wavelength conversion, which may result in a reduction in wavelength conversion efficiency. Thus, in the first aspect, the coolant is enclosed in the sealed housing and the cooling part is provided on a portion of an external surface of the sealed housing. Further, the liquid coolant can be made to flow through the plurality of micro-passages formed by the gaps between the particles that include phosphor particles. The flow of the liquid coolant through the micro-passages is driven by capillary force.

When the temperature of the phosphor particles rises, the coolant around the phosphor particles is vaporized, so that the phosphor particles can be cooled by the heat of vaporization. The vaporized coolant is made to flow into the region of the cooling part by natural convection, the vaporized coolant is cooled by the cooling part and is liquefied (condensed). The heat obtained from the phosphor particles is radiated to the outside of the sealed housing. The liquefied coolant again flows to the region of the phosphor particles by capillarity of the plurality of micro-passages. Thus, a cooling cycle is formed. Accordingly, a cooling cycle for the phosphor particles can be formed without the use of a driving source such as a pump, and reduction in light converting efficiency of the phosphor can be efficiently reduced.

In the present specification, the term "coolant" refers to a fluid that is vaporized by heat generated by a temperature rise in phosphor particles, and is liquefied by cooling by a cooling part. More specifically, as the coolant, water, particularly pure water is preferable, and depending on the temperature condition and on the pressure condition in the sealed housing, alcohol or ammonia may possibly be employed. The term "sealed housing" refers to a housing of a sealing structure that can prevent the liquefied coolant and the vaporized coolant in the housing from leaking to the outside. In the sealed housing 4 according to the first aspect, all surfaces of the sealed housing may be light-transmissive surfaces, part of the surfaces may be light-transmissive surfaces, or a portion of one surface may be light-transmissive surface. The sealed housing can be made of metal material, resin material, glass, ceramics, or a combination of those. For the "cooling part", a heat-dissipating member such as a heat-dissipating fin or a cooling device that circulates a coolant or the like can be employed, or an appropriate known cooling method can also be employed. The cooling part may be arranged at an end portion or at an outer periphery of the sealed housing, or may be arranged at a center part of the sealed housing.

The term "micro-passages" refers to passages each having a cross section that causes capillary phenomenon, and includes passages formed by gaps between the particles, passages formed by a plurality of grooves, passages formed by a mesh-shaped member, and other appropriate passages that can cause capillary phenomenon. In the case where the micro-passage is formed by gaps between the particles, for example, the micro-passages can be defined by the particles with a diameter in a range of 1 µm to 1 mm that are disposed in contact with each other, that is, as a continuity of the gaps between the particles. Alternatively, in the case where a cross-sectional area of a flow passage is converted into a circular cross section, the micro-passage can be defined as a flow passage of a diameter in a range of 1 µm to 1 mm. In particular, in the case where the particles are phosphor particles, the micro-passage is preferably defined by the particles with a diameter in a range of 1 µm to 1 mm that are disposed in contact with each other, that is, as a continuity of the gaps between the particles, or alternatively, the micro-passage can be defined as a flow passage of a diameter in a range of 1 µm to 1 mm.

In the first aspect, the sealed housing includes a channel where a liquid coolant flows through the micro-passages and a gas channel region where vaporized coolant flows. On the basis of the difference in specific gravity between liquid and gas, it is preferable that the channel where a liquid coolant flows be located at a lower side and the gas channel region where vaporized coolant flows be located at a higher side in the sealed housing. The gas channel region where vaporized coolant flows by natural convection may be a space or may have an object provided with an airway or a porous substance. Further, the gas channel region may be provided with micro-passages, that is, micro-passages may be formed throughout the in the whole of the sealed housing. In this case, the micro-passages where liquid coolant flows by capillary phenomenon are arranged at a lower side and the micro-passages where gaseous coolant flows by natural convection are arranged at a higher side in the sealed housing.

The amount of the coolant in the sealed housing is preferably 10% (volume) or less, or an amount so that inner pressure of the sealed housing is not excessively increased by the evaporated coolant. That is, it is preferable that a very suitable amount of the coolant be determined in view of cooling capacity, internal pressure, strength of the sealed housing (to prevent leakage), and so forth.

In the first aspect, all particles may be phosphor particles or the particles may include other particles such as light diffusing material particles. In this case, the region of phosphor particles and the region of other particles may be arranged separately, or phosphor particles and other particles may be intermingled.

As described above, in the first aspect, when the temperature of the phosphor particles rises, the coolant around the phosphor particles is vaporized. The vaporized coolant flows toward the cooling part and cooled by the cooling part and liquefied. The liquefied coolant is then by capillarity the plurality of micro-passages, made to flow toward the phosphor particles region where the temperature is increased again. With a cooling cycle described above, the phosphor particles can be cooled without the use of a. large cooling device that has a pump or the like, and reduction in light converting efficiency of the phosphor particles can be efficiently reduced. Thus, according to the first aspect, the wavelength converting member that can cool the fluorescent material efficiently without using a driving source and exhibits low energy consumption in operation can be provided.

A wavelength converting member according to a second aspect of the present disclosure has a configuration as described in the first aspect described above, except that in the channel, the phosphor particles are arranged in an incident region where light from the outside enters.

According to the second aspect, the phosphor particles are arranged in the incident region where light from the outside enters, so that the wavelength of the incident light can be converted to emit light of a desired wavelength region.

A wavelength converting member according to a third aspect of the present disclosure has a configuration as described in the second aspect described above, except that in the channel, a plurality of layers each containing at least one kind of particles or a single layer containing at least one kind of particles is formed in the incident region.

In the present specification, the term "different kind of particles" may be referred to as phosphor particles and particles other than phosphors, phosphor particles of different phosphors, or phosphor particles of different phosphors and particles other than phosphors. According to the third aspect, in the incident region, for example, in the case where a plurality of layers each containing phosphor particles and/or particles of light diffusing material is formed, incident light can be diffused by the particles of light diffusing material, so that wavelength converted light can be emitted with substantially uniform optical intensity. Further, in the case where a plurality of layers each containing one or more kinds of phosphor particles that emit light of different wavelengths or a single layer made of particles of one or more kinds of phosphors, light of a desired wavelength region and having high color rendering properties can be emitted. Thus, according to the third aspect, a plurality of layers each containing at least one kind of particles or a single layer containing at least one kind of particles is formed in the incident region in the channel, so that wavelength converted light that is very suitable to the intended use can be emitted.

A wavelength converting member according to a second aspect of the present disclosure has a configuration as described in the second or third aspect described above, except that the micro-passages are extended to connect the region where the cooling part is arranged and the incident region.

This aspect of the disclosure includes the case where only the micro-passages that are formed by gaps between the particles are extended to connect the region where the cooling part is arranged and the incident region; the case where in addition to the micro-passages defined by the particles, other flow passages that can generate capillary phenomenon are extended to connect the region where the cooling part is arranged and the incident region; and the case where a flow passage formed by combining the micro-passages defined by the particles and other flow passages that can generate capillary phenomenon connects the region where the cooling part is arranged and the incident region. According to the fourth aspect of the disclosure, the micro-passages are extended to connect the region where the cooling part is arranged and the incident region. This ensures the formation of a cooling cycle for the phosphor particles by a coolant.

A wavelength converting member according to a fifth aspect of the present disclosure has a configuration as described in one of the first to fourth aspects described above, except that light diffusing material particles are included in the particles.

According to the fifth aspect of the disclosure, the light diffusing material particles are included in the particles, so that light that enters through a light-transmissive surface can be diffused to obtain substantially uniform optical intensity and the light extraction efficiency can be improved. This is effective especially in the case where light from a semiconductor laser having strong directivity enters.

A wavelength converting member according to a sixth aspect of the present disclosure has a configuration as described in one of the first to fifth aspects described above, except that the particles are bonded by a coating layer formed on the surfaces of the particles while defining gaps between the particles.

According to the sixth aspect of the disclosure, the particles are bonded by a coating layer formed on the surfaces of the particles that allows for obtaining of a stable structure without filling resin between the particles, and accordingly, gaps can be formed between the particles. The micro-passages can be formed along the gaps, and that can ensure flow of the liquefied coolant.

A wavelength converting member according to a seventh aspect of the present disclosure has a configuration as described in one of the first to sixth aspects described above, except that a portion of the micro-passages are formed by a plurality of grooves defined in an inner surface of the sealed housing.

According to the seventh aspect of the disclosure, a portion of the micro-passages are formed by a plurality of grooves defined in an inner surface of the sealed housing, so that together with the micro-passages formed by the gaps between the particles, a greater amount of the liquid coolant can be made to flow efficiently.

A wavelength converting member according to a eighth aspect of the present disclosure has a configuration as described in one of the first to seventh aspects described above, except that a portion of the micro-passages are formed by a mesh-shaped member.

According to the eighth aspect of the disclosure, a portion of the micro-passages are formed by a mesh-shaped member, so that together with the micro-passages formed by the gaps between the particles, in some cases, further together with the plurality of grooves defined in an inner surface of the sealed housing, a greater amount of the liquid coolant can be made to flow efficiently.

A wavelength converting member according to a ninth aspect of the present disclosure has a configuration as described in one of the first to eighth aspects described above, except that the cooling part is arranged at an end portion or at an outer periphery of the sealed housing.

According to the ninth aspect of the disclosure, the cooling part is arranged at an end portion or at an outer periphery of the sealed housing, so that by disposing the phosphor particles at center portion of the sealed housing, a cooling cycle by a coolant can be formed between the center portion of the sealed housing and both end portions of the sealed housing or entire peripheral portion. Thus, efficient cooling of the phosphor can be realized.

A light source device according to a tenth aspect of the present disclosure includes the wavelength converting member according to one of the first to eighth aspects and a light source to emit light to the wavelength converting member.

In the present specification, for the "light source", an appropriate light source such as a semiconductor laser (LD) and a light emitting diode (LED) can be used. A light source device according to a tenth aspect of the present disclosure can be applied for desired usage, such as light source device for projectors, general lighting devices, backlight for display devices, and lighting device for vehicles. According to the tenth aspect of the disclosure, all the effects exerted by the wavelength converting member according to the aspects described above can be obtained, and a light source device that can cool the phosphor efficiently without using a driving source and exhibits low energy consumption in operation can be provided. Next, a light source device according to certain aspects of the present disclosure and a projector equipped with the light source device will be described in detail with referring to the drawings.

First Embodiment

Light Source Device Having Wavelength Converting Member According to First Embodiment First, an overview of a light source device having a wavelength converting member according to the first embodiment of the present disclosure will be described with reference to FIG. 1. FIG. 1 is a schematic cross-sectional view showing a light source device 50 having a wavelength converting member 2 according to the first embodiment of the present disclosure. As shown in FIG. 1, the light source device 50 includes a wavelength converting member 2 and a light source 40 to emit light to the wavelength converting member 2. In the first embodiment, the wavelength converting member 2 is arranged at an upper side and the light source 40 is arranged at a lower side in the gravity direction. As the light source 40, a semiconductor laser (LD) is used, but any other appropriate light source such as a light emitting diode (LED) can also be used.

The wavelength converting member 2 includes a sealed housing 4 in which a coolant is sealed, a cooling part 30 disposed on parts of outer surfaces of the sealed housing 4, and a channel 6 arranged in the sealed housing 4 and having a plurality of micro-passages that allow liquid coolant to flow therein. In the present specification, the term "coolant" refers to a fluid that is vaporized by heat generated by a temperature rise in phosphor, and is liquefied by cooling by a cooling part. More specifically, as the coolant, water, particularly pure water is preferable, and depending on the temperature condition and on the pressure in the sealed housing, alcohol or ammonia may possibly be employed.

he sealed housing 4 is a housing of a sealing structure that can prevent the liquefied coolant and the vaporized coolant in the housing from leaking to the outside. The sealed housing 4 shown in the cross-sectional view in FIG. 1 may be substantially rectangular parallelepiped in shape with substantially rectangular upper and lower surfaces (see FIG. 6A) or substantially cylindrical in shape with substantially circular upper and lower surfaces (see FIG. 6B). The cooling part 30 is arranged on the outer surfaces of both end portions of the sealed housing 4 in the case where the sealed housing 4 is substantially rectangular parallelepiped in shape, and on the outer circumferential surface of the sealed housing 4 in the case where the sealed housing 4 is substantially cylindrical in shape. The cooling part 30 may be arranged at an end portion or at an outer periphery of the sealed housing 4, or may be arranged at a center part of the sealed housing 4 (see FIG. 9). The channel 6 is arranged at a lower side in the sealed housing 4 and a gas channel region 8 (a space in the first embodiment) that allows vaporized coolant to flow by natural convection is arranged at an upper side in the sealed housing 4. The channel 6 having plurality of micro-passages is extended to connect the region where the cooling part 30 is arranged and the incident region 60.

The channel 6 is formed by bonding phosphor particles 10 and the micro-passages are formed by the gaps between the particles 10. In the present specification, the term "micro-passages" refers to passages each having a cross section that causes capillary phenomenon, and includes passages formed by gaps between the particles, passages formed by a plurality of grooves, passages formed by a mesh-shaped member, and other appropriate passages that can cause capillary phenomenon. In the case where the micro-passage is formed by gaps between the particles, for example, the micro-passages can be defined by the particles with a diameter in a range of 1 μm to 1 mm that are disposed in contact with each other, that is, as a continuity of the gaps between the particles. Alternatively, in the case where a cross-sectional area of a flow passage is converted into a circular cross section, the micro-passage can be defined as a flow passage of a diameter in a range of 1 μm to 1 mm. In particular, in the case where the particles are phosphor particles, the micro-passage is preferably defined by the particles with a diameter in a range of 1 μm to 1 mm that are disposed in contact with each other, that is, as a continuity of the gaps between the particles, or alternatively, the micro-passage can be defined as a flow passage of a diameter in a range of 1 μm to 1 mm.

In the first embodiment, the sealed housing 4 is made of a light-transmissive material, so that light emitted from the light source 40 enters the sealed housing 4 of the wavelength converting member 2 (see the white upward arrow in FIG. 1) and is incident on the phosphor particles 10 arranged in the incident region 60. Upon incident of light from the light source 40, the phosphor particles 10 emit wavelength-converted light in a wavelength range that is different from that of the incident light. The wavelength-converted light emitted from the phosphor particles 10 is then emitted (see the cross-hatched upward arrow in FIG. 1) from the emission region 70 on the surface of the sealed housing that is on the side opposite to the light source 40. For example, in the case where the light source 40 emits blue light, the phosphor particles 10 to emit red light upon incident of the blue light, the phosphor particles 10 to emit green light upon incident of the blue light, and/or the phosphor particles 10 to emit yellow light upon incident of the blue light can be employed. In the case of employing the phosphor particles 10 to emit yellow light upon incident of the blue light, the yellow light can be mixed with the blue light that is from the light source 40 and is not subjected to the wavelength conversion, and white light can be emitted.

Upon incident of light from the light source 40, the phosphor particles 10 arranged in the incident region 60 in the sealed housing 4 emits wavelength-converted light. At this time, the temperature of the phosphor particles 10 may be increased, which may result in a decrease in the wavelength conversion efficiency of the phosphor particles 10. in the first embodiment, when the temperature of the phosphor particles 10 rises, the coolant around the phosphor particles 10 is vaporized, so that the phosphor particles 10 can be cooled by the heat of vaporization. The vaporized coolant flows in the gas channel region 8 by natural convection to reach the regions at the both ends where the cooling parts 30 are disposed, where the vaporized coolant is cooled by the cooling parts 30 and liquefied (condensed). The heat obtained from the phosphor particles 10 is radiated to the outside of the sealed housing 4. The flow by natural convection can be described as below. The gaseous pressure increases in the region where the coolant is vaporized and the gaseous pressure decreases in the region where the coolant is liquefied. Due to the difference in the gaseous pressure, the vaporized coolant flows from the region where the coolant is vaporized to the region where the coolant is liquefied.

As shown in FIG. 1, in the first embodiment, the continuous micro-passages are formed by the gaps between the phosphor particles 10, and such a plurality of continuous micro-passages are extended to connect the region where the cooling part 30 is arranged and the incident region 60. Accordingly, the coolant is vaporized around the phosphor particles 10 that has a high temperature due to wavelength conversion and the vaporized coolant flows toward the cooling part 30 and cooled by the cooling part 30, then is liquefied. The liquefied coolant again flows to the incident region 60 through the plurality of micro-passages in the channel 6. Thus, a cooling cycle is formed. Such a flow cycle of the coolant is shown by the arrows in FIG. 1. The solid arrows indicate the flow of the liquefied coolant and the broken arrows indicate the flow of the vaporized coolant. As described above, a cooling cycle for the phosphor particles 10 can be formed without the use of a driving source such as a pump, and reduction in light converting efficiency of the phosphor particles 10 can be efficiently reduced.

According to the first embodiment, the micro-passages are extended to connect the region where the cooling part 30 is arranged and the incident region 60. This can ensure the formation of a cooling cycle for the phosphor particles by a coolant. In particular, the cooling part 30 is arranged at each end portion or at an outer periphery of the sealed housing 4, so that by disposing the phosphor particles 10 at center portion of the sealed housing 4, a cooling cycle by a coolant can be formed between the center portion of the sealed housing 4 and both end portions of the sealed housing 4 or entire peripheral portion. Thus, efficient cooling of the phosphor can be realized.

In the first embodiment, the gas channel region 8 where the vaporized coolant flows is a space, but the gas channel region 8 may have an object provided with an airway or a porous substance. Further, the gas channel region 8 may be provided with micro-passages. In this case, the gas channel region 8 includes the micro-passages (channel 6) where liquid coolant flows by capillary phenomenon and the micro-passages where gaseous coolant flows by natural convection (gas channel region 8).

Figure 2:
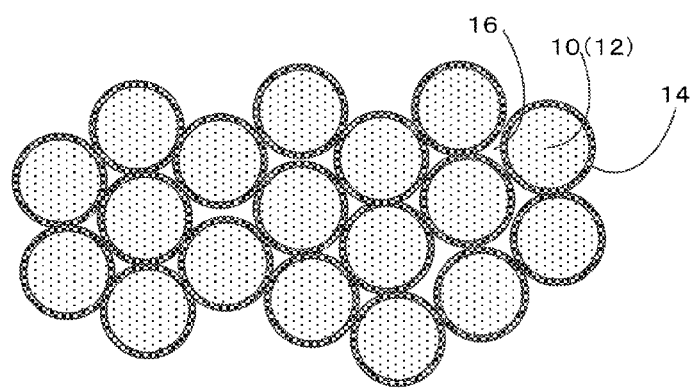
FIG. 2 is a schematic diagram showing an example of micro-passages formed by gaps between particles in the wavelength converting member shown in FIG. 1.

The channel 6 has a structure formed by bonding phosphor particles 10 and the micro-passages are formed by the gaps between the particles 10. FIG. 2 is a schematic diagram showing an example of micro-passages formed by gaps between particles 10 in the wavelength converting member 2 shown in FIG. 1. As shown in FIG. 2, the phosphor particles 10 are bonded by a coating layer formed on the surfaces of the phosphor particles 10 while defining gaps between the phosphor particles 10.

Method of forming Channel

An example of method of forming such a channel as described above will be shown below. First, phosphor particles and oxide particles are mixed in an organic solvent (for example, butyl carbitol acetal) and resin (for example, ethyl cellulose, acrylic-based resin, or the like) to prepare a paste, and with the use of a printing method, the paste is applied to the location in the housing where the channel to be formed. Next, the organic solvent and the resin are removed and calcination is performed at a temperature of 300° C. or higher, preferably at a temperature of 400° C. or higher to almost completely remove the resin. With this, a plurality of oxide particles are adhered on the surfaces of the phosphor particles, and a coating layer is further formed on the surfaces of the phosphor particles and the oxide particles in such state. The coating layer is preferably an inorganic material, and allows for forming the channel that includes the gaps between the phosphor particles (that is, include the micro-passages). In particular, $Al_2O_3$, $SiO_2$, or the like is preferably used for the coating layer, and further preferably, the oxide particles are same materials as the coating layer. Examples of the method of forming the coating layer include an atomic layer deposition (ALD) method, a sol-gel method, an organic metal chemical vapor phase growth (MOCVD) method, a plasma-enhanced chemical vapor deposition (PECVD) method, a chemical vapor deposition (CVD) method, an atomospheric-pressure plasma film-forming method, a sputtering method, and a vapor deposition method, among those, an atomic layer deposition (ALD) method is preferably used.

According to the first embodiment, the particles are bonded by a coating layer formed on the surfaces of the phosphor particles 10 that allows for obtaining of a stable structure without filling resin between the particles, and accordingly, gaps can be formed between the phosphor particles 10. The micro-passages can be formed along the gaps, and that can ensure flow of the liquefied coolant.

In the embodiment illustrated in FIG. 1, all particles that define the micro-passages are phosphor particles 10, but other appropriate arrangement can be employed as long as the phosphor particles 10 are arranged in the channel 6 at least in the incident region 60 where light from the outside enters. According to the first embodiment, the phosphor particles 10 are arranged in the incident region 6 where light from the outside enters, so that the wavelength of the incident light can be converted to emit light of a desired wavelength region.

Components of Wavelength Converting Member 2 and Light Source Device 50

Components that form the wavelength converting member 2 and the light source device 50 will be described in more detail below.

Light Source 40

In the case of using a blue semiconductor laser as the light source 40, a semiconductor laser to emit light in a wavelength range of 370 nm to 500 nm is preferable and a wavelength range of 420 nm to 500 nm is more preferable. For the light source 40, other than the blue semiconductor lasers, a semiconductor laser of an appropriate wavelength range can also be used, and other types of light sources such as a light emitting diode (LED) can also be used.

Sealed Housing 4

Figure 7:
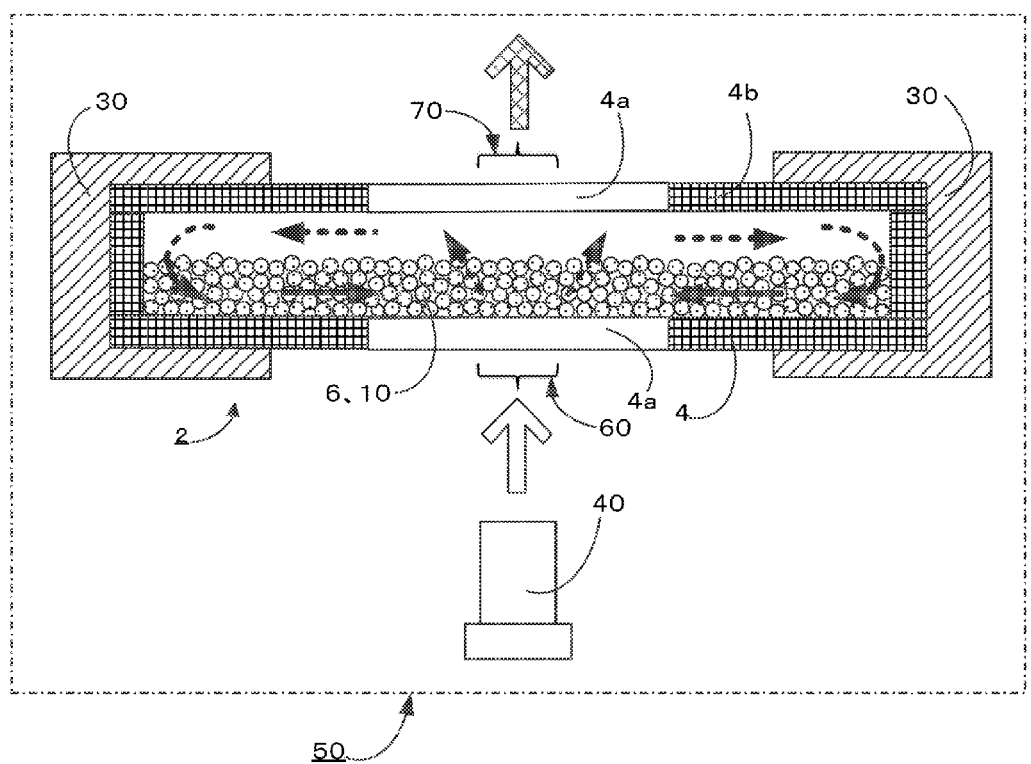
FIG. 7 is a schematic cross-sectional view showing a light source device having a wavelength according to a fifth embodiment of the present disclosure.

The sealed housing 4 serves as a heat sink housing, so that preferably has a high thermal conductivity. In view of high thermal conductivity, metal material such as copper, aluminum, stainless steel, or the like can be exemplified, but resin material, sapphire, gallium nitride, glass, ceramic material, or the like can also be used. In particular, the sealed housing has a light-transmissive surface, and in order to form the light-transmissive surface, the use of resin material, sapphire, gallium nitride, glass, or the like is necessary. The sealed housing 4 shown in FIG. 1 is made of glass and all surfaces of the sealed housing 4 have a light-transmissive surface. The sealed housing 4 may also have a configuration in which only one surface has light-transmissive property (FIG. 8), or only a portion of one surface has light-transmissive property (FIG. 7). For example, in the case where only a portion of one surface has light-transmissive property, it is also considerable that the portion impermeable to light is formed with metal material and the light-transmissive portion is formed with resin material or glass. Also, a sealed housing 4 that is formed by integrally molding (two-color molding) light-impermeable resin material and light-transmissive resin material can also be used.

Cooling Part 30

For the cooling part 30, a heat-dissipating member such as a heat-dissipating fin or a cooling device that circulates a coolant or the like can be employed, or an appropriate known cooling method can be employed.

Phosphor Particles 10

For the phosphor particles 10, red phosphor particles to emit red light, green phosphor particles to emit green light, and yellow phosphor particles to emit yellow light, respectively upon incident of the blue light can be exemplified. The red phosphor particles to emit red light preferably emit red fluorescent light in a wavelength range of about 600 nm to about 800 nm. Specific examples of the material thereof include (Sr, Ca)$AlSiN_3$:Eu, $CaAlSiN_3$:Eu, $SrAlSiN_3$:Eu, and $K_2SiF_6$:Mn. The green phosphor particles to emit green light preferably emit green fluorescent light in a wavelength range of about 500 nm to about 560 nm. Specific examples of the material thereof include $\beta\text{-Si}_{6-Z}\text{Al}_Z\text{O}_Z\text{N}_{8-Z}$:Eu, $\text{Lu}_3\text{Al}_5\text{O}_{12}$:Ce, $\text{Ca}_8\text{MgSi}_4\text{O}_{16}\text{C}_{B2}$:Eu, $\text{Ba}_3\text{Si}_6\text{O}_{12}\text{N}_2$:Eu, and $(\text{Sr, Ba, Ca})\text{Si}_2\text{O}_2\text{N}_2$:Eu. The yellow phosphor particles to emit yellow light preferably emit yellow to red fluorescent light in a wavelength range of about 540 nm to about 700 nm. Examples of the material thereof include a phosphor based on yttrium aluminum oxide-based phosphor activated with cerium and more specifically include $\text{YAlO}_3$:Ce, $\text{Y}_3\text{Al}_5\text{O}_{12}$:Ce (YAG:Ce), and $\text{Y}_4\text{Al}_2\text{O}_9$:Ce, and further, a mixture of those. Such a yttrium aluminum oxide-based phosphor may contain at least one of Ba, Sr, Mg, Ca, and Zn. Also, addition of Si can reduce the crystal growth reaction, which allows obtaining of phosphor particles of similar size.

Filter

The incident region 60 and the emission region 70 of the sealed housing 4 can be provided with a filter by vapor deposition of a dielectric multilayer film. According to the usage and wavelength range of light to transmit or reflect, the filter of an appropriate type such as a short-pass filter, a band-pass filter, and a long-pass filter can be employed. In order to reduce unevenness in luminance and chromaticity, a diffusion agent such as particles of $\text{SiO}_2$, $\text{TiO}_2$, $\text{Ba}_2\text{SO}_4$, or the like can be applied. With the use of such a filter, light from the light source 40 can be prevented from being reflected in the incident region 60 of the sealed housing 4 and light of predetermined wavelength range alone can be emitted from the emission region 70. Thus, light source 50 of high performance can be realized.

As described above, according to the first embodiment illustrated in FIG. 1, when the temperature of the phosphor particles 10 rises, the coolant around the phosphor particles 10 is vaporized, so that the phosphor particles 10 can be cooled by the heat of vaporization. The vaporized coolant flows in the gas channel region 8 to reach the regions where the cooling parts 30 are disposed, where the vaporized coolant is cooled by the cooling parts 30 and liquefied. At this time, the heat obtained from the phosphor particles 10 is radiated to the outside of the sealed housing 4. The liquefied coolant again flows to the incident region 60 by capillarity of the plurality of micro-passages in the channel 6. With a cooling cycle described above, the phosphor particles 10 can be cooled without the use of a large cooling device that has a pump or the like, and reduction in light converting efficiency of the phosphor particles 10 can be efficiently reduced. Thus, according to the first embodiment, the wavelength converting member 2 and the light source device 50 that can cool the phosphor particles 10 efficiently without using a driving source and exhibits low energy consumption in operation can be provided. Also, with the wavelength converting member having such a configuration described above, miniaturization of the wavelength converting member can be realized and the wavelength converting member of lower miniaturing cost can be obtained. The light source device 50 according to the first embodiment can be applied for desired usage, such as light source device for projectors, general lighting devices, backlight for display devices, and lighting device for vehicles.

As described above, in the embodiments shown in FIG. 3 to FIG. 9 to be described below, vaporized coolant and liquefied coolant are made to flow in a horizontal direction that is also in a lateral direction of the wavelength converting member and the light source device, but other appropriate configuration can also be employed so that the vaporized coolant and the liquefied coolant flow in a vertical direction that is also in a direction perpendicular to the lateral direction. The detail of such configuration will be described below with reference to FIG. 10.

Second Embodiment

Figure 3:
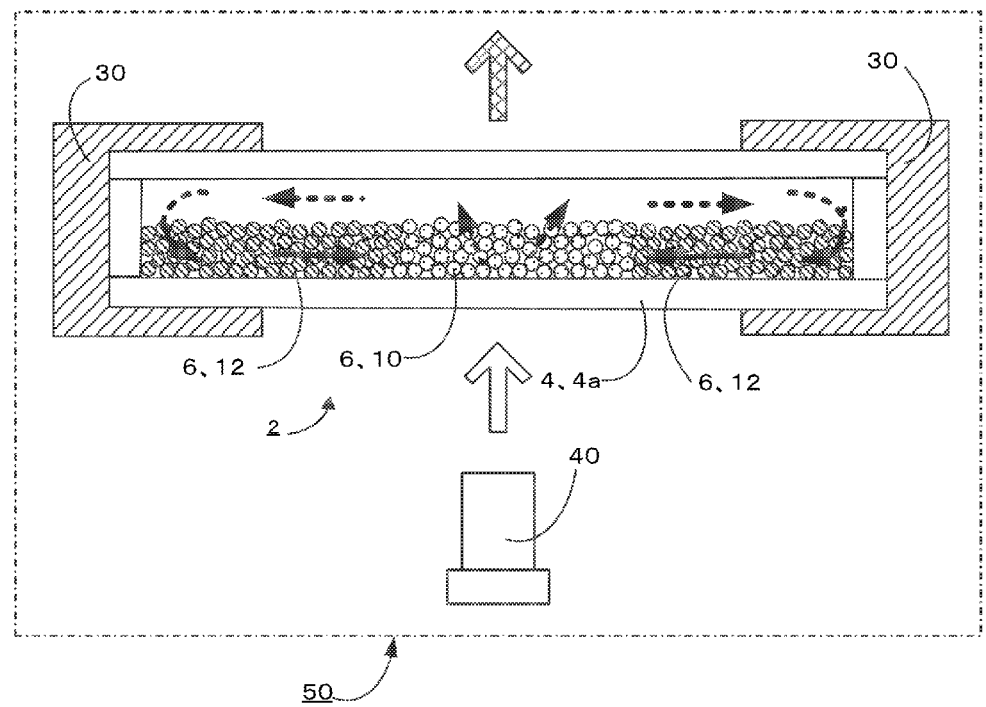
FIG. 3 is a schematic cross-sectional view showing a light source device having a wavelength according to a second embodiment of the present disclosure.

Light Source Device Having Wavelength Converting Member According to Second Embodiment Next, with reference to FIG. 3, a light source device 50 having a wavelength converting member 2 according to a second embodiment will be described. FIG. 3 is a schematic cross-sectional view showing a light source device 50 having a wavelength converting member 2 according to the second embodiment of the present disclosure. The second embodiment illustrated in FIG. 3 and the first embodiment illustrated in FIG. 1 have the same or similar except for the channel 6. Accordingly, in the present embodiment, the difference from that of the first embodiment illustrated in FIG .1 will be mainly described and description of the same or similar configuration to those illustrated in FIG. 1 will be appropriately omitted.

In FIG. 3, the channel 6 has different in two regions of an incident region 60 and its periphery and a region surrounding the incident region 60 and its periphery (including the end-part region in the sealed housing 4). That is, the phosphor particles 10 are arranged in the incident region 60 and its periphery in the channel 6 and light diffusing material particles 12 are arranged in the surrounding region. As described above, the light diffusing material particles 12 are arranged, so that light spreading from the incident region 60 can be diffused by the light diffusing material particles 12. Thus, substantially uniform optical intensity can be obtained and substantially uniform wavelength-converted light can be emitted (see single net upward arrow). Examples of the light diffusing material particles 12 include particles of $\text{SiO}_2$, $\text{TiO}_2$, and $\text{BaSO}_4$, but any other appropriate particles may also be used.

Continuous micro-passages can be formed by gaps between the phosphor particles 10, gaps between the light diffusing material particles 12, and gaps between the phosphor particles 10 and the light diffusing material particles 12. Such continuous micro-passages are extended to connect the region where the cooling part 30 is arranged and the incident region 60. Accordingly, in a similar manner as that described above, the coolant around the phosphor particles 10 that has a high temperature due to wavelength conversion is vaporized, the vaporized coolant flows toward the cooling part 30 and cooled by the cooling part 30 and is liquefied. The liquefied coolant flows into the incident region 60 again by capillarity of a plurality of micro-passages in the channel 6. Thus, a cooling cycle is formed. Such a flow cycle of the coolant is shown by the arrows in FIG. 2. The solid arrows indicate the flow of the liquefied coolant and the broken arrows indicate the flow of the vaporized coolant. As described above, a cooling cycle for the phosphor particles 10 can be formed without the use of a driving source such as a pump, and reduction in light converting efficiency of the phosphor particles 10 can be efficiently reduced.

In the second embodiment, the phosphor particles 10 are arranged in the incident region 60 and its periphery and the light diffusing material particles 12 are arranged in the surrounding region, so that light spreading from the incident region 60 can be diffused by the light diffusing material particles 12. Thus, light extraction efficiency can be improved.

Third Embodiment

Figure 4:
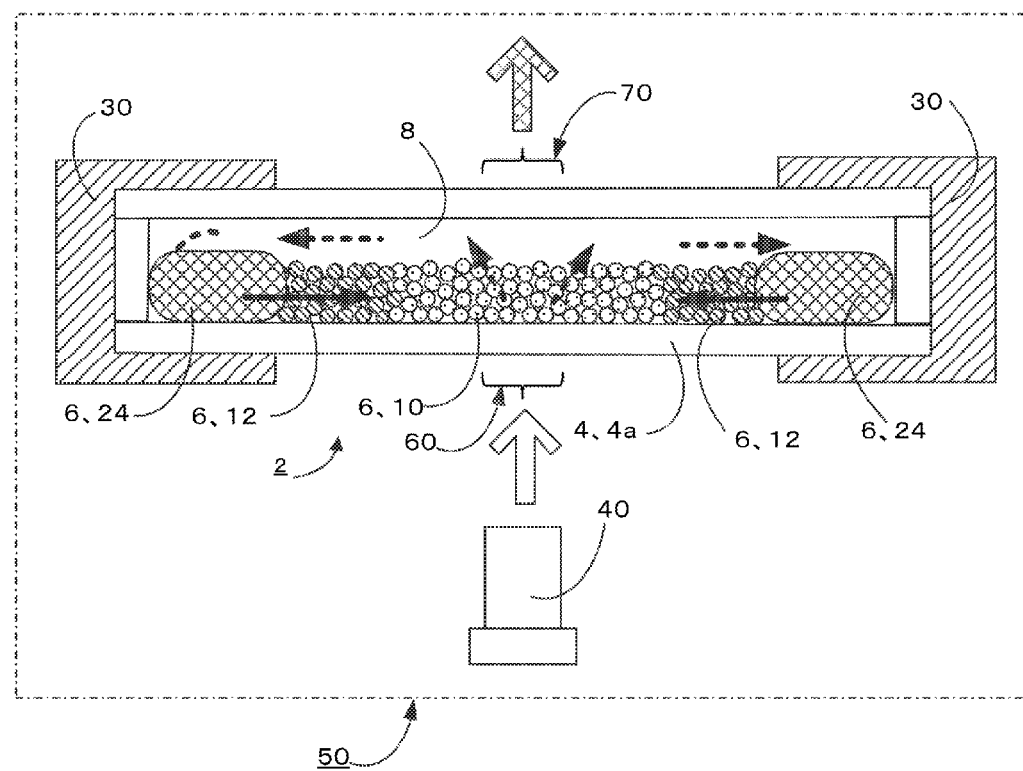
FIG. 4 is a schematic cross-sectional view showing a light source device having a wavelength according to a third embodiment of the present disclosure.

Light Source Device Having Wavelength Converting Member According to Third Embodiment Next, with reference to FIG. 4, a light source device 50 having a wavelength converting member 2 according to a third embodiment of the present disclosure will be described. FIG. 4 is a schematic cross-sectional view showing a light source device 50 having a wavelength converting member 2 according to a third embodiment of the present disclosure. The third embodiment illustrated in FIG. 4 and the first embodiment and second embodiments shown in FIG. 1 and FIG. 2 have the same or similar except for the channel 6. Accordingly, in the present embodiment, the difference from that of the first embodiment and the second embodiment illustrated in FIG. 1 and FIG. 2 will be mainly described and description of the same or similar configuration will be appropriately omitted.

In FIG. 4, the channel 6 has different in three regions of an incident region 60 and its vicinity, a region surrounding the incident region 60 and its periphery, and end portion regions of the sealed housing 4. That is, the phosphor particles 10 are arranged in the incident region 60 and its vicinity in the channel 6 and light diffusing material particles 12 are arranged in the surrounding region. The mesh-shaped member 24 has a capillary structure so-called wick of heat sink, and can be formed with metal material such as copper, aluminum, or stainless steel, alloyed material, or porous nonmetal material.

Continuous micro-passages formed with a mesh-shaped member 24 is formed in each of the end portion regions of the sealed housing 4, and as described above, together with the gaps between the phosphor particles 10, gaps between the light diffusing material particles 12, and gaps between the phosphor particles 10 and the light diffusing material particles 12, continuous micro-passages can be formed. Thus, a plurality of continuous micro-passages that is formed with the mesh-shaped member 24, the light diffusing material particles 12, and the phosphor particles 10 is extended to connect the regions where the cooling parts 30 are arranged and the incident region 60.

Accordingly, in a similar manner as that described above, the coolant around the phosphor particles 10 that has a high temperature due to wavelength conversion is vaporized, the vaporized coolant flows toward the cooling part 30 and cooled by the cooling part 30 and is liquefied. The liquefied coolant flows into the incident region 60 again by capillarity of a plurality of micro-passages in the channel 6. Thus, a cooling cycle is formed. Such a flow cycle of the coolant is shown by the arrows in FIG. 4. The solid arrows indicate the flow of the liquefied coolant and the broken arrows indicate the flow of the vaporized coolant. As described above, a cooling cycle for the phosphor particles 10 can be formed without the use of a driving source such as a pump, and reduction in light converting efficiency of the phosphor particles 10 can be efficiently reduced.

According to the third embodiment of the disclosure, a portion of the micro-passages in the channel 6 is formed with a mesh-shaped member 24, so that together with the micro-passages formed by the gaps between the particles, a greater amount of the liquid coolant can be made to flow efficiently.

Fourth Embodiment

Light Source Device Having Wavelength Converting Member According to Fourth Embodiment Next, with reference to FIG. 5, a light source device 50 having a wavelength converting member 2 according to a fourth embodiment of the present disclosure will be described. FIG. 5 is a schematic cross-sectional view showing a light source device 50 having a wavelength converting member 2 according to the fourth embodiment of the present disclosure. The fourth embodiment illustrated in FIG. 5 and the first, second, and third embodiments respectively shown in FIG. 1, FIG. 3 and FIG. 4 have the same or similar except for the channel 6. Accordingly, in the present embodiment, the difference from that of the first, second, and third embodiments respectively shown in FIG. 1, FIG. 3, and FIG. 4 will be mainly described and description of the same or similar configuration will be appropriately omitted.

Figure 5A:
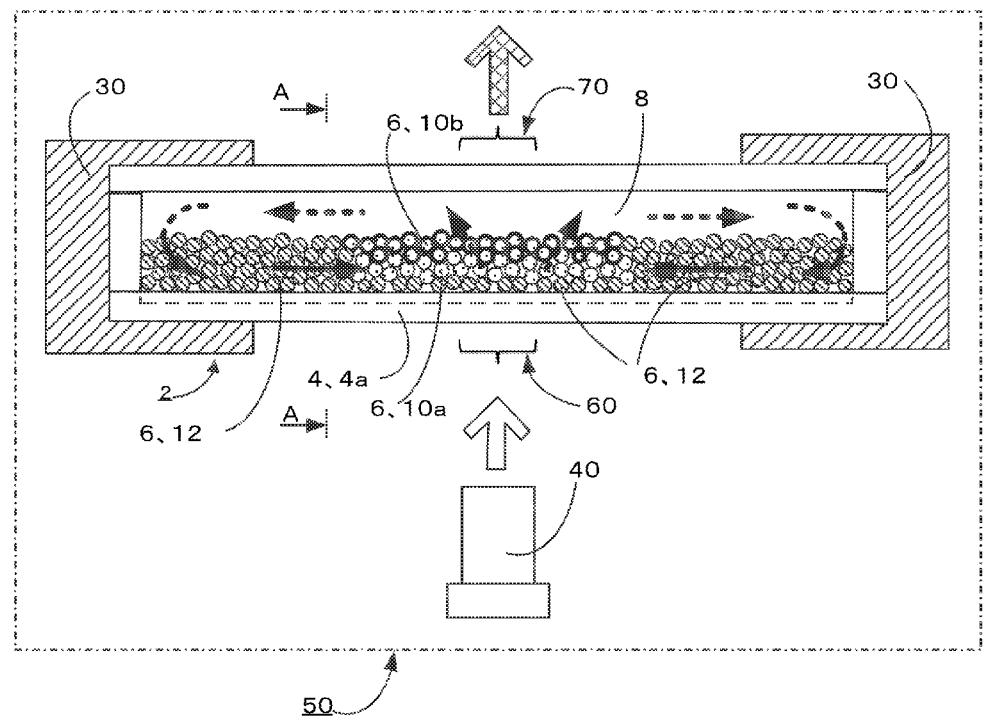
FIG. 5A is a schematic cross-sectional view showing a light source device having a wavelength according to a fourth embodiment of the present disclosure.

In FIG. 5A, the channel 6 has different in two regions of an incident region 60 and its vicinity and a region surrounding the incident region 60 and its periphery (including the end portion regions in the sealed housing 4). That is, different kind of particles of yellow phosphor particles 10a and red phosphor particles 10b and light diffusing material particles 12 are arranged in the incident region 60 and its vicinity, and the light diffusing material particles 12 alone are arranged in the region surrounding the incident region 60 and its vicinity. In the incident region 60 and its vicinity, the light source 12, the yellow phosphor particles 10a, the red phosphor particles 10b are layered in this order from the side closer to the light source 40. With this configuration, light (white upward arrow in FIG. 5A) from the light source 40 can be diffused by the light diffusing material particles 12 to obtain substantially uniform optical intensity, then the wavelength of the light is converted by the yellow phosphor particles 10a and the red phosphor particles 10b and emitted from the emission region 70 (cross-hatched upward arrow in FIG. 5A). With the use of the yellow phosphor and red phosphor, red light with high color rendering properties can be emitted. Accordingly, a red light source device that can emit light of substantially uniform intensity and high color rendering properties can be provided.

As described above, according to the fourth embodiment of the disclosure, a plurality of layers made of different kind of particles is formed in the incident region 60 and its vicinity in the channel 6, so that wavelength converted light that is very suitable to the intended use can be emitted. In some cases, a single layer made of different kind of particles may be formed in the incident region 60 and its periphery.

Figure 5B:
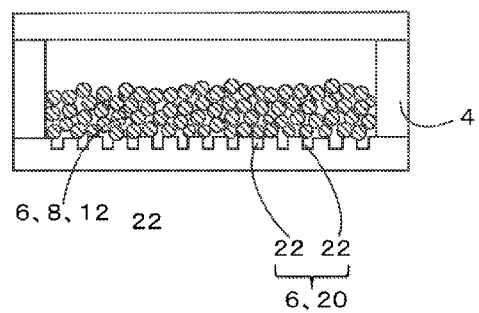
FIG. 5B is a schematic cross-sectional view taken along the direction of arrows A-A in FIG. 5A.

Further, in the fourth embodiment, a groove region 20 including a plurality of grooves 22 formed in an inner surface of the sealed housing 4 is provided as a part of the micro-passages. As shown in FIG. 5B that is a schematic cross-sectional view taken along the direction of arrows A-A in FIG. 5A, the groove region 20 defining a plurality of fine grooves 22 is provided in an inner surface on the lower side of the sealed housing 4, so that the liquefied coolant can flow in the fine grooves 22 by capillarity. That is, the fine grooves 22 correspond to the micro-passages.

Figure 6A:
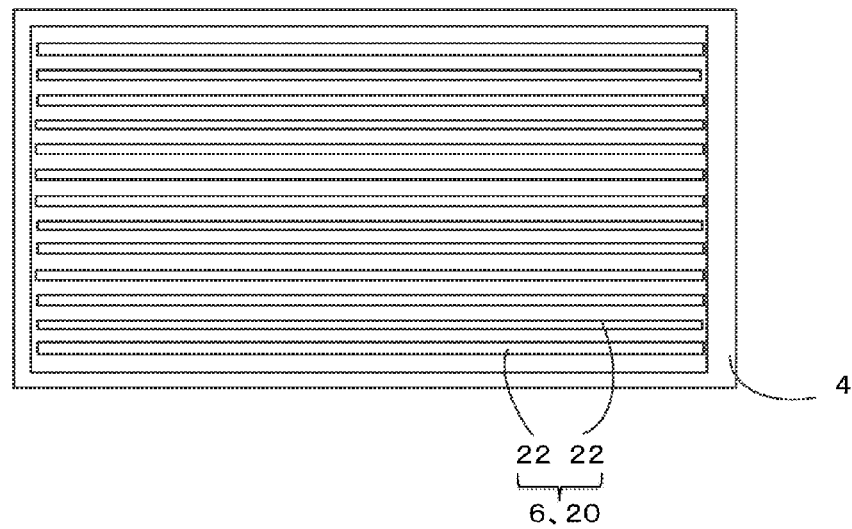
FIG. 6A and FIG. 6B are schematic diagrams each showing an example of micro-passages formed by a plurality of grooves defined in an inner surface of a sealed housing.
Figure 6B:
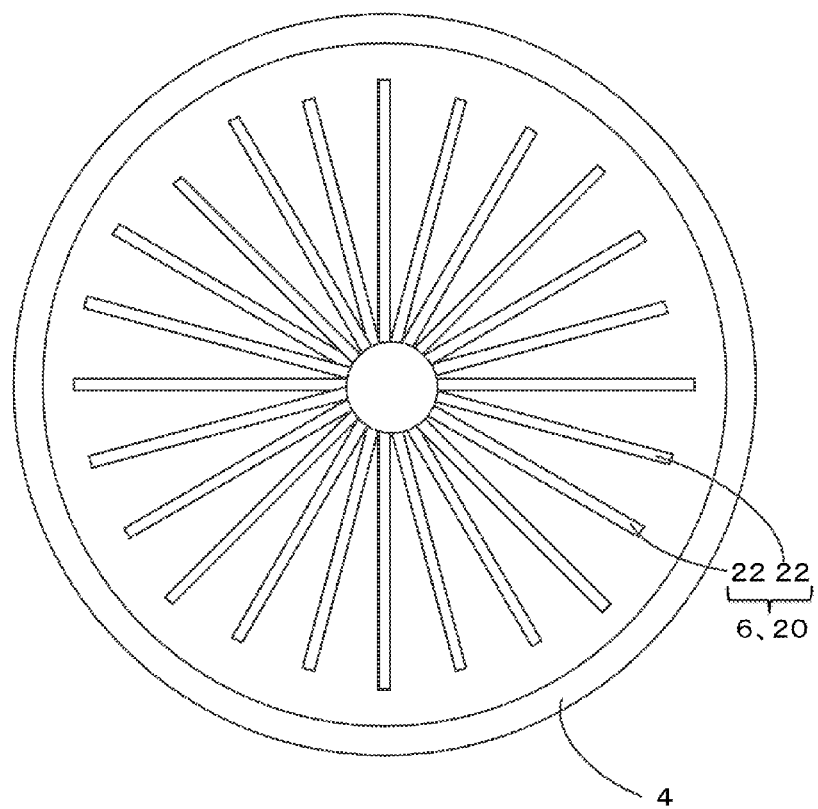

The groove region 20 defining a plurality of fine grooves 22 will be described in more detail below with reference to FIG. 6. FIG. 6 is a schematic diagram showing an inner surface on the lower side of the sealed housing 4, illustrating an example of micro-passages formed by a plurality of grooves defined in the inner surface of the sealed housing 4. FIG. 6A shows a case where a sealed housing 4 is substantially rectangular parallelepiped in shape with substantially rectangular upper and lower surfaces. FIG. 6B shows a case where a sealed housing 4 is substantially cylindrical in shape with substantially circular upper and lower surfaces. In the case of FIG. 6A where the sealed housing 4 has a substantially rectangular lower surface, a plurality grooves 22 is formed extending linearly from one end portion to the other end portion. In this case, the incident region 60 is formed at the center portion of the groove region 20. Meanwhile, in the case of FIG. 6B where the sealed housing 4 has a substantially circular lower surface, a plurality grooves 22 is formed radially and linearly extending from the center region of the circle. In this case, the incident region 60 is formed at the center portion of the circle.

As described above, the incident region 60 having the phosphor particles is arranged at the center portion of the sealed housing 4, so that the liquefied coolant can be made to flow from the both end portions or from the whole outer peripheral portion of the housing toward the center portion of the sealed housing by capillarity of the micro-passages formed by gaps between the particles and the micro-passages formed in the groove region 20 formed by a plurality of grooves 22.

The micro-passages in the channel 6 according to the fourth embodiment as shown in FIG. 5 includes a region formed by gaps between the particles and a second region of the groove region 20 arranged under the region formed by gaps between the particles. The first region formed by gaps between the particles is formed with yellow phosphor particles 10a, red phosphor particles 10b, and light diffusing material particles 12 at the incident region 60 and its periphery, and with light diffusing material particles 12. Continuous micro-passages can be formed by gaps between the yellow phosphor particles 10a, the red phosphor particles 10b, and the light diffusing material particles 12. As described above, the continuous micro-passages defined by the particles are extended to connect the region where the cooling part 30 is arranged and the incident region 60. Accordingly, the liquefied coolant can be made to flow in a directions as that in the plurality of grooves 2 shown in FIG. 6A or FIG. 6B.

Thus, according to the fourth embodiment of the disclosure, a portion of the micro-passages are formed by a plurality of grooves defined in an inner surface of the sealed housing 4, so that together with the micro-passages formed by the gaps between the particles, a greater amount of the liquid coolant can be made to flow efficiently.

As described above, the coolant around the phosphor particles 10 that has a high temperature due to wavelength conversion is vaporized, the vaporized coolant flows toward the cooling part 30 and cooled by the cooling part 30 and is liquefied. The liquefied coolant flows into the incident region 60 again by capillarity of a plurality of micro-passages in the channel 6. Thus, a cooling cycle is formed. Such a flow cycle of the coolant is shown by the arrows in FIG. 5. The solid arrows indicate the flow of the liquefied coolant and the broken arrows indicate the flow of the vaporized coolant. As described above, a cooling cycle for the phosphor particles 10 can be formed without the use of a driving source such as a pump, and reduction in light converting efficiency of the phosphor particles 10 can be efficiently reduced.

Fifth Embodiment

Light Source Device Having Wavelength Converting Member According to Fifth Embodiment Next, with reference to FIG. 7, a light source device 50 having a wavelength converting member 2 according to a fifth embodiment of the present disclosure will be described. FIG. 7 is a schematic cross-sectional view showing a light source device 50 having a wavelength converting member 2 according to the fifth embodiment of the present disclosure. The fifth embodiment illustrated in FIG. 7 and the first embodiment illustrated in FIG. 1 have the same or similar except for the configuration of the surfaces of the sealed housing 4. Accordingly, in the present embodiment, the difference from that of the first embodiment illustrated in FIG. 1 will be mainly described and description of the same or similar configuration to those illustrated in FIG. 1 will be appropriately omitted.

All surfaces of the sealed housing 4 shown in FIG. 4 are light-transmissive surfaces, but in the fifth embodiment illustrated in FIG. 7, a portion of two surfaces have light-transmissive property. That is, a surface of the sealed housing 4 on the side closer to the light source 40 includes a light-transmissive portion 4a in the incident region 60 and its vicinity region, and non-light-transmissive portions 4b in other regions. In a similar manner, a surface of the sealed housing 4 on the side away from to the light source 40 includes a light-transmissive portion 4a in the emission region 70 and its vicinity region, and non-light-transmissive portions 4b in other regions.

More specific examples include the light-transmissive portion 4a made of resin material or glass and the non-light transmissive portion 4b made of metal material. In this case, a metal material having a high thermal conductivity can be used for a portion of the sealed housing 4, so that cooling efficiency for the phosphor particles 10 can be increased. In particular, the region to be in contact with the cooling part 30 can be formed with metal material, so that cooling of the vaporized coolant can be enhanced. Meanwhile, it is possible to form the light-transmissive portion 4a and the non-light-transmissive portion 4b by integrally molding (two-color molding). In this case, manufacturing can be facilitated and sealing property can also be easily improved.

Sixth Embodiment

Figure 8:
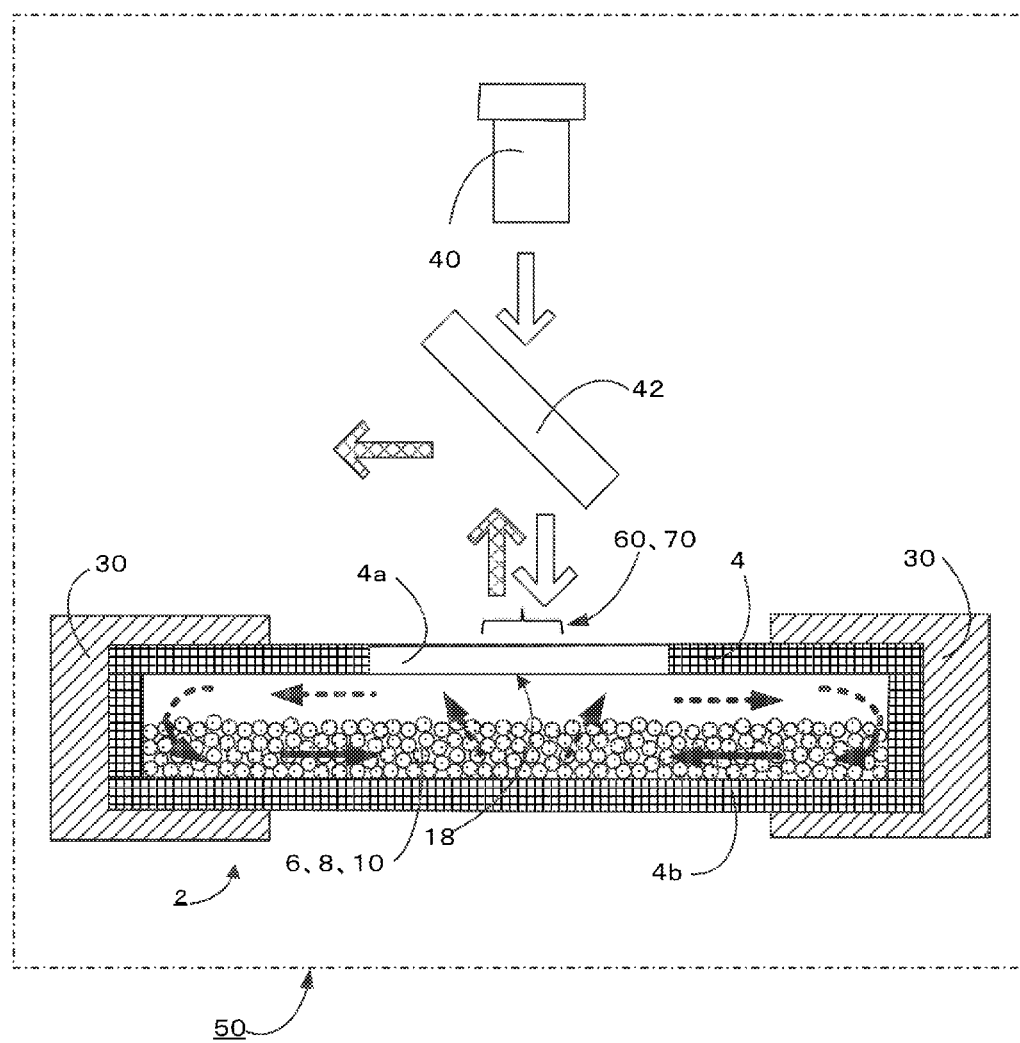
FIG. 8 is a schematic cross-sectional view showing a light source device having a wavelength according to a sixth embodiment of the present disclosure.

Light Source Device Having Wavelength Converting Member According to Sixth Embodiment Next, with reference to FIG. 8, a light source device 50 having a wavelength converting member 2 according to a sixth embodiment of the present disclosure will be described. FIG. 8 is a schematic cross-sectional view showing a light source device 50 having a wavelength converting member 2 according to the sixth embodiment of the present disclosure. From a comparison of the present embodiment illustrated in FIG. 8 with the embodiments illustrated in FIG. 1, FIG. 2 to FIG. 7, transmission type light source device 50 is shown in the embodiments illustrated in FIG. 1, FIG. 2 to FIG. 7, while a reflecting type light source device 50 is shown in the embodiment illustrated in FIG. 8. The sixth embodiment illustrated in FIG. 8 and the first embodiment illustrated in FIG. 1 have the same or similar configuration except for the configuration of the surfaces of the sealed housing 4. Accordingly, in the present embodiment, the difference from that of the first embodiment illustrated in FIG. 1 will be mainly described and description of the same or similar configuration to those illustrated in FIG. 1 will be appropriately omitted.

All surfaces of the sealed housing 4 shown in FIG. 1 are light-transmissive surfaces, but in the sixth embodiment illustrated in FIG. 8, a portion of only one surface has light-transmissive property, and the surface on the side away from the light source 4 of the sealed housing 4. That is, a surface of the sealed housing 4 on the side closer to the light source 40 includes a light-transmissive portion 4a in the incident region 60 and non-light-transmissive portions 4b in other regions. Also, the entire surface on the side of the sealed housing 4 away from the light source 40 is formed with non-light-transmissive portion 4b. Further, the inner surface of the side of the sealed housing 4 away from the light source 40 is a reflecting surface 18 on which a reflecting layer to reflect light is disposed.

In the light source device 50 according to the sixth embodiment illustrated in FIG. 8, an optical member 42 is disposed between the light source 40 and the wavelength converting member 2. The optical member 42 is configured to transmit light in a wavelength range as the light from the light source 40 and reflect light in other wavelength range, which serve as a dichroic mirror. That is, light emitted from the light source 40 passes through the optical member 42 and incident on the wavelength converting member 2 (white downward arrows in FIG. 8) and wavelength converted by the phosphor particles 10. The wavelength-converted light is then reflected by the reflecting surface 18 in the sealed housing 4 at the side away from the light source 40 and emitted again (cross-hatched upward arrow in FIG. 8) form the wavelength converting member 2, and then reflected by the optical member 42 in a perpendicular direction (cross-hatched leftward arrow in FIG. 8).

Seventh Embodiment

Figure 9:
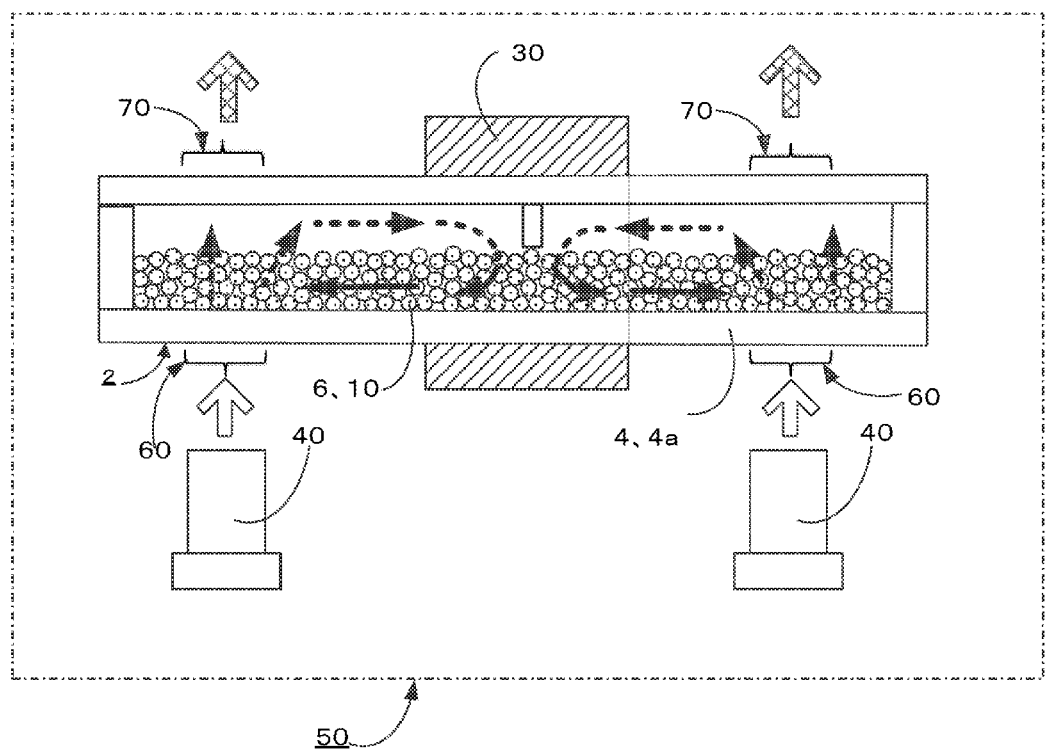
FIG. 9 is a schematic cross-sectional view showing a light source device having a wavelength according to a seventh embodiment of the present disclosure.

Light Source Device Having Wavelength Converting Member According to Seventh Embodiment Next, with reference to FIG. 9, a light source device 50 having a wavelength converting member 2 according to a seventh embodiment of the present disclosure will be described. FIG. 9 is a schematic cross-sectional view showing a light source device 50 having a wavelength converting member 2 according to a seventh embodiment of the present disclosure. From a comparison, the seventh embodiment illustrated in FIG. 9 differs from the embodiments illustrated in FIG. 1, FIG. 2 to FIG. 8, in that, the cooling part 30 is arranged at each end portion of or outer peripheral portion of the sealed housing 4 in the embodiments illustrated in FIG. 1, FIG. 2 to FIG. 8, while the cooling part 30 is arranged at the middle portion (center portion) of the sealed housing 4 in the seventh embodiment illustrated in FIG. 9. Other are basically the same or similar, so that the difference will be described below and the same or similar to those of the embodiments shown in FIG. 1 or the like will be appropriately omitted.

In the seventh embodiment illustrated in FIG. 9, a cooling part 30 is arranged on a middle portion (center portion) of each outer surface of the sealed housing 4, and incident regions 60 and emission region 70 are arranged at both sides of the cooling part 30 of respective sides. Correspondingly, two light sources 40 are provided in the present embodiment.

In the incident region 60 on the left side of the cooling part 30 in FIG. 9, the coolant around the phosphor particles 10 that has a high temperature due to wavelength conversion is vaporized, and the vaporized coolant flows (from the left to the right in FIG. 9) toward the vicinity of the cooling part 30 and cooled by the cooling part 30, then is liquefied. The liquefied coolant flows (from the right to the left in FIG. 9) to the incident region 60 again by capillarity of a plurality of micro-passages in the channel 6. Thus, a cooling cycle is formed. Similarly, in the incident region 60 on the right side of the cooling part 30 in FIG. 9, the coolant around the phosphor particles 10 that has a high temperature due to wavelength conversion is vaporized, and the vaporized coolant flows (from the right to the left in FIG. 9) toward the vicinity of the cooling part 30 and cooled by the cooling part 30, then is liquefied. The liquefied coolant flows (from the left to the right in FIG. 9) to the incident region 60 again by capillarity of a plurality of micro-passages in the channel 6. Thus, a cooling cycle is formed. Such a flow cycle of the coolant is shown by the arrows in FIG. 9. The solid arrows indicate the flow of the liquefied coolant and the broken arrows indicate the flow of the vaporized coolant.

According to the seventh embodiment, performance of plural light source devices can be obtained with a single set of cooling parts 30. Moreover, it is possible to provide three or more incident regions 60 in a single wavelength converting member 2 by arranging the cooling part 30 between the respective incident regions 60. For example, a light source device can be exemplified that includes an incident region having red phosphor particles, an incident region having green phosphor particles, and an incident region having only a light diffusing material particles (i.e., no-wavelength conversion), and further includes three light sources to emit blue light corresponding to the incident regions. Light of desired color can be emitted by adjusting the output of each light source of the light source device described above.

Eighth Embodiment

Figure 10:
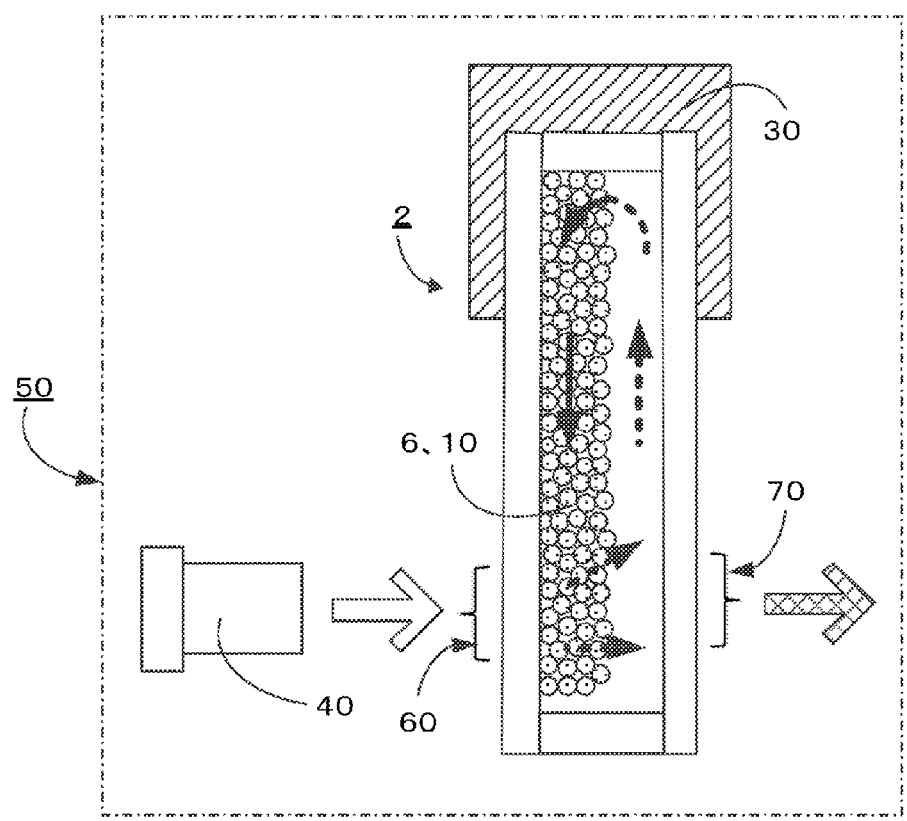
FIG. 10 is a schematic cross-sectional view showing a light source device having a wavelength according to an eighth embodiment of the present disclosure.

Light Source Device Having Wavelength Converting Member According to Eighth Embodiment Next, with reference to FIG. 10, a light source device 50 having a wavelength converting member 2 according to an eighth embodiment of the present disclosure will be described. FIG. 10 is a schematic cross-sectional view showing a light source device 50 having a wavelength converting member 2 according to the eighth embodiment of the present disclosure. From a comparison, the eighth embodiment illustrated in FIG. 10 differs from the embodiments illustrated in FIG. 1 and FIG. 2 to FIG. 9, in that, a cooling part 30 are arranged at both sides of an incident region 60 in the embodiments illustrated in FIG. 1, FIG. 2 to FIG. 9, while a cooling part 30 is arranged at only one side of the incident region 60 in the eighth embodiment illustrated in FIG. 10.

Further, the eighth embodiment illustrated in FIG. 10 differs from the embodiments illustrated in FIG. 1 and FIG. 2 to FIG. 9, in that, the cooling part 30 and the incident region 60 are arranged in a horizontal direction in the embodiments illustrated in FIG. 1 and FIG. 2 to FIG. 9, while the cooling part 30 is arranged at an upper side and the incident region 60 is arranged at a lower side in the direction of gravity in the embodiment illustrated in FIG. 10. In this case, the wavelength converting member 2 and the light source 40 are arranged in a horizontal direction. Other configurations are basically the same or similar, so that the difference will be described below and the configurations that are the same or similar to those of the embodiments shown in FIG. 1 or the like will be appropriately omitted. With an arrangement such as shown in FIG. 10, liquefied coolant flows from upper side to lower side, in which in addition to capillarity of the micro-passages, a flowing force by gravity is applied, and that can ensure flow of the liquefied coolant. Meanwhile the vaporized coolant flows from lower side to upper side, to which the force of gravity is applied in the direction of disturbing the flow, but the force of natural convection due to a difference in the gaseous pressure is greater than the force of gravity. Thus, the flow is not affected.

Ninth Embodiment

Figure 11:
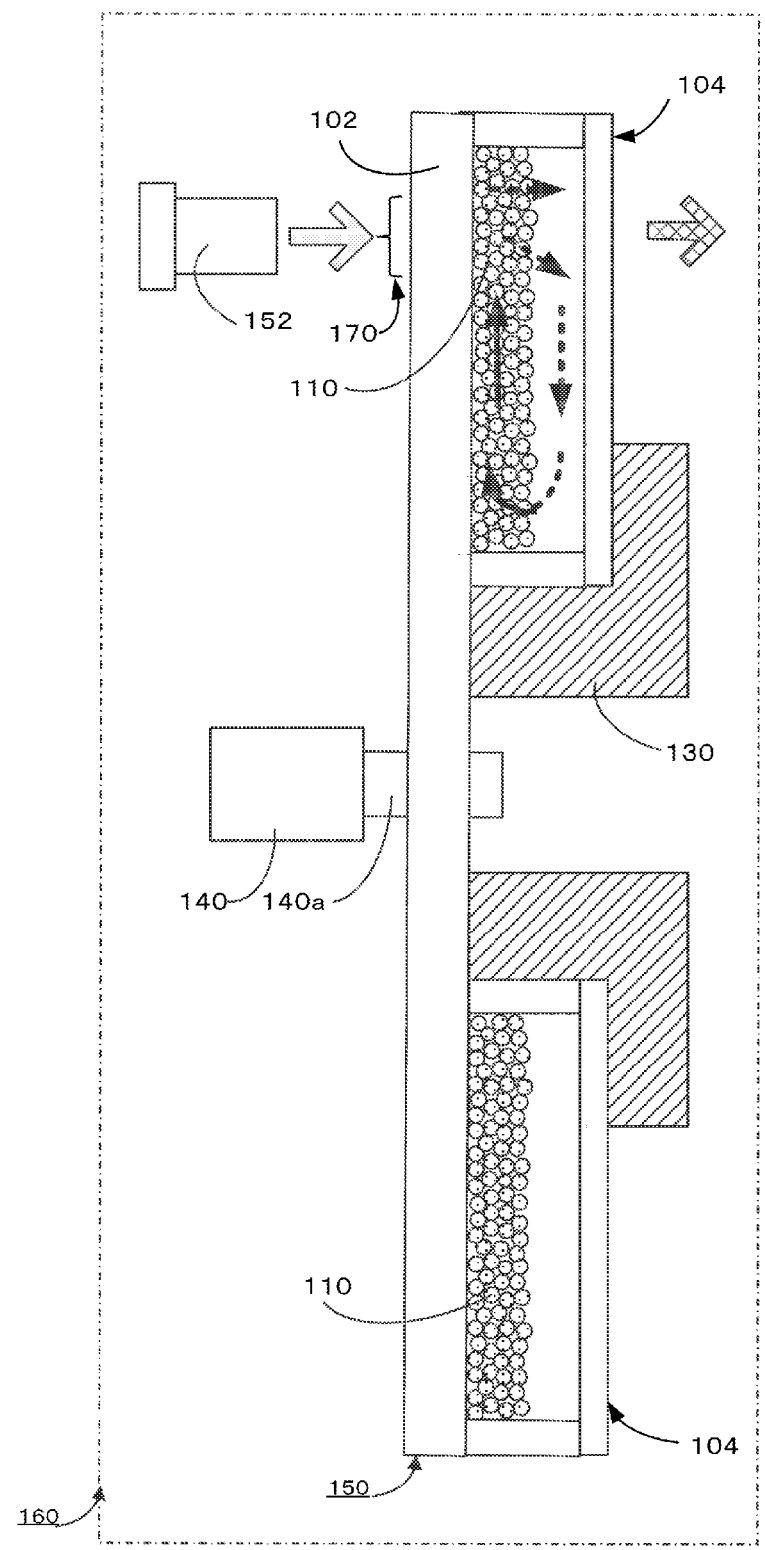
FIG. 11 is a schematic cross-sectional view showing a light source device having a wavelength according to a ninth embodiment of the present disclosure.

Light Source Device Having Wavelength Converting Member According to Ninth Embodiment Next, with reference to FIG. 11, a light source device 160 having a wavelength converting member according to a ninth embodiment of the present disclosure will be described. FIG. 11 is a schematic cross-sectional view showing a light source device 160 having a wavelength converting member according to a third embodiment of the present disclosure. In the light source device shown in FIG. 11, the light source device 160 includes a phosphor wheel 150 and a light source 152 to emit light to the phosphor wheel 150. The phosphor wheel 150 includes a rotating substrate 102 having a sealed housing 104 in which a coolant is sealed, and a cooling device 130 to cool the vaporized coolant. The light source device 160 also has a driving device 140 to rotate the rotating substrate 102 around a rotating shaft 140a. Further, an incident region 170 configured to receive light from outside is arranged on the outer circumferential side of the rotating substrate 102 of the sealed housing 104, a cooling device 130 is arranged on a portion of the sealed housing 104 closer to the rotating shaft 140*a* of the rotating substrate 102 than to the incident region 170 of the sealed housing 104, and the incident region 170 in the sealed housing 104 has phosphor particles 110. According to the present (ninth) embodiment, a rise in temperature of the phosphor particles 110 causes the coolant around the phosphor particles 110 to vaporize. The vaporized coolant flows toward the cooling device 130 and cooled by the cooling device 130 and liquefied. The liquefied coolant can be made to flow to a region of the phosphor particles 110 by centrifugal force generated by the rotation of the rotating substrate 102.

While the present invention has been described according to the embodiments and the aspects with a certain degrees of details, contents of disclosure of the embodiments and aspects shall be varied in details of the configuration, and the combination of elements and the change of order in the embodiments and aspects can be realized without deviating from the scope of the claims and contents of the present invention.

What is claimed is:

1. A wavelength converting member comprising:
   a sealed housing which is at least partially light transmissive;
   a coolant enclosed in the sealed housing;
   a cooling part provided on a part of an external surface of the sealed housing; and
   a channel having a plurality of micro-passages allowing a liquid coolant flowing therein;
   wherein at least a portion of said micro-passages are formed by gaps between particles which are bonded to each other, and
   wherein phosphor particles are contained in the particles.

2. The wavelength converting member according to claim 1, wherein the channel has an incident region configured to receive light from outside and phosphor particles are disposed in the incident region.

3. The wavelength converting member according to claim 2, wherein in the incident region, a plurality of layers each containing at least one kind of particles or a single layer containing at least one kind of particles is formed in the channel.

4. The wavelength converting member according to claim 2, wherein the micro-passages extending so as to connect the region provided with the cooling part and the incident region.

5. The wavelength converting member according to claim 1, wherein the cooling part comprises support member, and wherein the support member is a heat dissipating member.

6. The wavelength converting member according to of claim 1, wherein the particles are bonded by a coating layer formed on surfaces of the particles, while leaving gaps between the particles.

7. The wavelength converting member according to claim 1, wherein a portion of the micro-passages is formed by a plurality of grooves defined in inner surfaces of the sealed housing.

8. The wavelength converting member according to claims 1, wherein a portion of the micro-passages is formed by a mesh-shaped member.

9. The wavelength converting member according to claim 1, wherein the cooling part is arranged on an end portion or an outer periphery of the sealed housing.

10. A light source device comprising the wavelength converting member according to claim 1 and a light source to emit light to the wavelength converting member.

11. A wavelength converting member comprising:
    a sealed housing which is at least partially light transmissive;
    a coolant enclosed in the sealed housing;
    a cooling part provided on a part of an external surface of the sealed housing; and
    a channel having a plurality of micro-passages allowing a liquid coolant flowing therein;
    wherein at least a portion of said micro-passages are formed by gaps between particles which are bonded to each other,
    wherein phosphor particles are contained in the particles,
    wherein the channel has an incident region configured to receive light from outside and phosphor particles are disposed in the incident region, and
    wherein the cooling part is arranged on an end portion or an outer periphery of the sealed housing.

12. The wavelength converting member according to claim 11, wherein in the incident region, a plurality of layers each containing at least one kind of particles or a single layer containing at least one kind of particles is formed in the channel.

13. The wavelength converting member according to claim 11, wherein the micro-passages extending so as to connect the region provided with the cooling part and the incident region.

14. The wavelength converting member according to claim 11, wherein the cooling part comprises a support member, and wherein the support member is a heat dissipating member.

15. The wavelength converting member according to of claim 11, wherein the particles are bonded by a coating layer formed on surfaces of the particles, while leaving gaps between the particles.

16. The wavelength converting member according to claim 11, wherein a portion of the micro-passages is formed by a plurality of grooves defined in inner surfaces of the sealed housing.

17. The wavelength converting member according to claims 11, wherein a portion of the micro-passages is formed by a mesh-shaped member.

18. A light source device comprising the wavelength converting member according to claim 11 and a light source to emit light to the wavelength converting member.

* * * * *